(12) United States Patent
Zimmer et al.

(10) Patent No.: US 7,598,736 B2
(45) Date of Patent: Oct. 6, 2009

(54) INTEGRATED CIRCUIT INCLUDING MAGNETO-RESISTIVE STRUCTURES

(75) Inventors: Jürgen Zimmer, Ottobrunn (DE); Klemens Prügl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 158 days.

(21) Appl. No.: 11/845,440

(22) Filed: Aug. 27, 2007

(65) Prior Publication Data
US 2009/0058402 A1   Mar. 5, 2009

(51) Int. Cl.
*G01R 33/02* (2006.01)
*G01R 33/06* (2006.01)
(52) U.S. Cl. .............. 324/252; 324/207.21; 324/235
(58) Field of Classification Search ......... 324/207.11, 324/207.13, 207.21, 252, 235
See application file for complete search history.

(56) References Cited

U.S. PATENT DOCUMENTS

| | | |
|---|---|---|
| 5,796,249 A | 8/1998 | Andräet et al. |
| 6,246,233 B1 | 6/2001 | Griffen et al. |
| 6,300,758 B1 | 10/2001 | Griffen et al. |
| 2001/0009367 A1 | 7/2001 | Seitzer et al. |
| 2005/0258820 A1* | 11/2005 | Forster .................. 324/165 |

* cited by examiner

*Primary Examiner*—Reena Aurora
(74) *Attorney, Agent, or Firm*—Dicke, Billig & Czaja, PLLC

(57) ABSTRACT

An integrated circuit includes two first adjacent magneto-resistive effect (xMR) structures. Each first xMR structure is configured to sense a first magnetic field direction. The integrated circuit includes two second adjacent xMR structures at a distance from the two first xMR structures. Each second xMR structure is configured to sense a second magnetic field direction. The two first xMR structures and the two second xMR structures are configured for in-plane magnetic field components perpendicular to the first magnetic field and the second magnetic field and phase shifted by approximately 90° from the first magnetic field and the second magnetic field acting on the two first xMR structures and the two second xMR structures.

22 Claims, 8 Drawing Sheets

INTEGRATED CIRCUIT INCLUDING MAGNETO-RESISTIVE STRUCTURES

BACKGROUND

Typical linear magneto-resistive (xMR) sensors for the detection of rotational speed are based on the measurement of an in-plane magnetic field component (e.g., x-component) along an axis defined by the running direction of a magnetic or ferromagnetic material passing the sensor. Under ideal orientations of the magnetic field axis to the sensor structure and with no unintended magnetic field components present, the linear xMR sensors can be designed to be highly precise and to have low hysteresis effect. In reality, however, several effects may impact the signal quality of the linear xMR sensors.

One effect that may impact the signal quality is phase shifted in-plane magnetic fields along an axis perpendicular to the desired measuring (i.e., x-component) magnetic field axis. For example in a pole wheel application, depending on the adjustment of the sensor structure, magnetic field components in the y-direction (i.e., y-components parallel to the axis of the pole wheel) may be present that are phase shifted by approximately 90° to the x-component magnetic field axis. Therefore, a rotating pole wheel passing the sensor structure results in a magnetic field vector rotating circularly or elliptically.

Another effect that may impact the signal quality is misalignment of the sensor structure due to a twisted chip in the sensor package (which is related to the package tolerance) or misalignment of the sensor structure to the desired magnetic field axis (which is related to the adjustment tolerance). The misalignment leads to a non-desired angle between the sensor structure and the axis of the magnetic field to be measured.

These effects can lead to hysteresis and jitter in the output signal of a linear xMR sensor designed for detecting only a single magnetic field component. Hysteresis and jitter adversely affect the performance of the xMR sensor, thereby complicating the development of further fields of application for the xMR sensor. Typical anisotropic magneto-resistive (AMR) sensors reduce hysteresis and jitter by using a constant auxiliary magnetic field having a component perpendicular to the magnetic field to be measured. As long as the disturbing y-component magnetic fields are lower than the x-component magnetic field to be measured, the y-component magnetic fields have no negative influence on the hysteresis behavior. The auxiliary magnetic field is typically provided by an auxiliary magnet mounted externally beneath the sensor structure. The auxiliary magnet increases the cost of the AMR sensor. In addition, there are magnetic field limits that may not be exceeded to guarantee proper sensor functionality.

For these and other reasons, there is a need for the present invention.

SUMMARY

One embodiment provides an integrated circuit. The integrated circuit includes two first adjacent magneto-resistive effect (xMR) structures. Each first xMR structure is configured to sense a first magnetic field direction. The integrated circuit includes two second adjacent xMR structures at a distance from the two first xMR structures. Each second xMR structure is configured to sense a second magnetic field direction. The two first xMR structures and the two second xMR structures are configured for in-plane magnetic field components perpendicular to the first magnetic field and the second magnetic field and phase shifted by approximately 90° from the first magnetic field and the second magnetic field acting on the two first xMR structures and the two second xMR structures.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
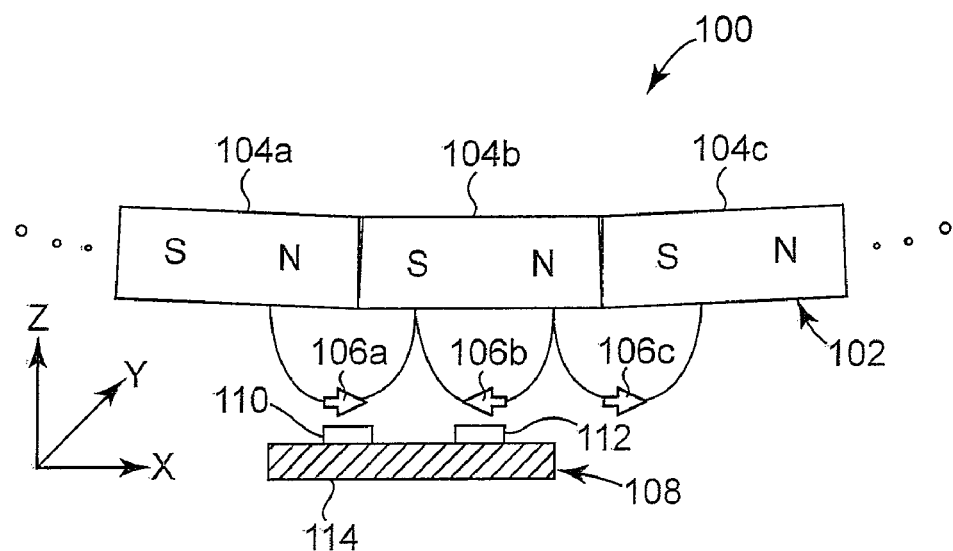
FIG. 1 is a diagram illustrating one embodiment of a rotational speed sensor based on xMR structures and a pole wheel.

FIG. 1 is a diagram illustrating one embodiment of a rotational speed sensor 100 based on xMR structures and a pole wheel. Rotational speed sensor 100 includes a pole wheel 102 and an integrated circuit xMR sensor 108. Pole wheel 102 includes a plurality of dipoles 104a-104c. In one embodiment, each dipole 104a-104c includes a permanent magnet having a north pole and a south pole. The north pole of each dipole 104a-104c is adjacent a south pole of an adjacent dipole 104a-104c.

Dipoles 104a-104c generate alternating magnetic fields. For example, dipoles 104a and 104b generate magnetic field 106a, dipole 104b generates magnetic field 106b, and dipoles 104b and 104c generate magnetic field 106c. Magnetic field 106a is 180° out of phase with magnetic field 106b. Magnetic field 106b is 180° out of phase with magnetic field 106c. In one embodiment, pole wheel 102 is replaced with a tooth wheel in combination with a back bias magnet to generate the alternating magnetic fields.

Integrated circuit xMR sensor 108 includes xMR sensor elements 110 and 112 and a substrate 114. The xMR sensor elements 110 and 112 sense the magnetic fields generated by pole wheel 102. For example, xMR sensor elements 110 sense magnetic field 106a, and xMR sensor elements 112 sense magnetic field 106b. By combining signals generated by the xMR sensor elements 110 and 112, the rotational speed of pole wheel 102 is determined.

The xMR sensor elements 110 and 112 are based on anisotropic magneto-resistive (AMR) effect, giant magneto-resistive (GMR) effect, or tunnel magneto-resistive (TMR) effect stack structures. The xMR structures have a low or zero magnetic anisotropy. Integrated circuit xMR sensor 108 does not use any auxiliary or bias magnetic field to operate under typical application conditions. Integrated circuit xMR sensor 108 provides greater sensor sensitivity compared to typical AMR sensors. In addition, integrated circuit xMR sensor 108 is more robust than typical AMR sensors regarding mechanical misalignment and external magnetic field components other than the magnetic field to be measured.

The xMR sensor elements 110 and 112 use wide structures (e.g., 10 µm or another suitable width) resulting in a minimum shape anisotropy effect for angle sensing. Thereby, the impact of the generated 180° magnetic domains near the sidewalls of the xMR structures on the electrical signal is suppressed. The xMR sensor elements 110 and 112 are suitable for detecting a varying magnetic field direction generated by a rotating transducer or pole wheel. In contrast, the sensor elements of typical linear sensors measure a varying magnetic field strength. Wide xMR structures are easier to fabricate than narrower structures used in typical linear sensors. In addition, narrower structures, depending on the fabrication process control and stability, can exhibit much higher performance drift under temperature storage as well as generally lower signals compared to wider structures. Wider structures enable a more controllable and stable fabrication process compared to narrower structures.

If rotating transducer or pole wheel 102 generates only x-component magnetic fields, the use of the xMR sensor elements 110 and 112 provide a switching signal change at low magnetic field variations. For applications where an electrical map of signatures in the transducer wheel is desired (e.g., for reference point detection), a 90° phase shifted y-component magnetic field at the location of xMR sensor elements 110 and 112 is generated. The y-component magnetic field is generated by applying a current through magnetic field generating lines that are placed adjacent xMR structures 110 and 112. The magnetic field generating lines are place above and/or below xMR sensor elements 110 and 112 to generate a lateral magnetic field component (i.e., y-component) perpendicular to the field to be measured (i.e., x-component).

Figure 2:
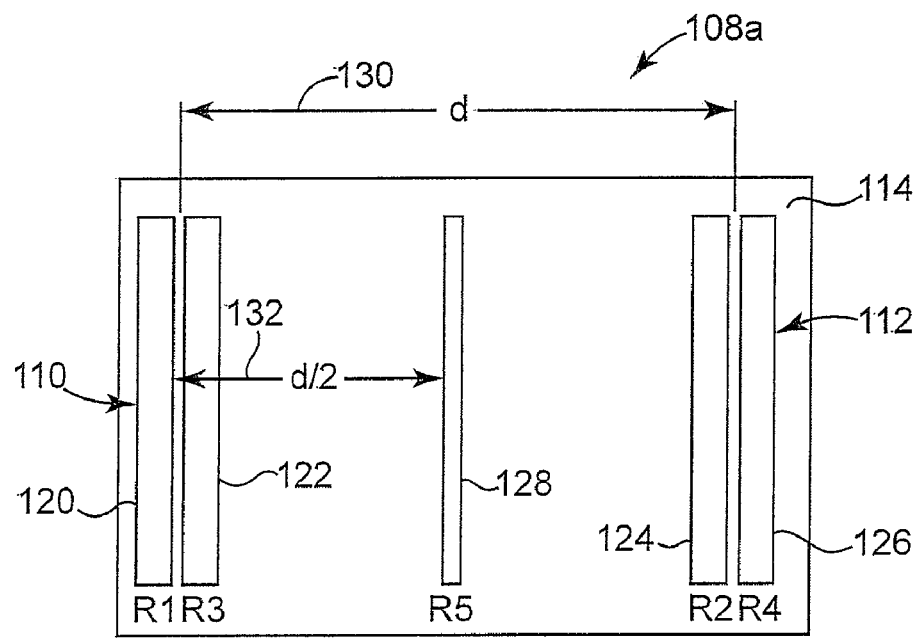
FIG. 2 illustrates a top view of one embodiment of an integrated circuit xMR sensor.

FIG. 2 illustrates a top view of one embodiment of an integrated circuit xMR sensor 108a. Integrated circuit xMR sensor 108a includes a substrate 114, xMR sensor elements 110 and 112, and xMR structure 128 (R5). The xMR sensor elements 110 include xMR structure 120 (R1) and xMR structure 122 (R3). The xMR structure 120 is adjacent to xMR structure 122. The xMR sensor elements 112 include xMR structure 124 (R2) and xMR structure 126 (R4). The xMR structure 124 is adjacent to xMR structure 126. The xMR sensor elements 110 are at a distance "d" as indicated at 130 from xMR sensor elements 112. The xMR structure 128 is about halfway between xMR sensor elements 110 and 112 at a distance "d/2" as indicated at 132 from xMR sensor elements 110 and 112.

The xMR structures 120, 122, 124, and 126 are wider than or have a lower aspect ratio than xMR structure 128. The xMR structures 120, 122, 124, and 126 have a zero or relatively low magnetic anisotropy, and xMR structure 128 has a relatively high magnetic anisotropy.

When a pole wheel 102 having a pole pitch of approximately d is rotated past xMR sensor 108a, xMR sensor elements 110 exhibit a low resistance when xMR sensor elements 112 exhibit a high resistance, and xMR sensor elements 110 exhibit a high resistance when xMR sensor elements 112 exhibit a low resistance. As further described below with reference to FIG. 4, the phase correlation of the response of xMR sensor 108a is approximately 180° between xMR sensor elements 110 and 112. Therefore, xMR structure 128 between xMR sensor elements 110 and 112 provides a +/−90° phase shifted signal with respect to the signals of xMR sensor elements 110 and 112.

A current proportional to the resistance of xMR structure 128 is generated and applied to magnetic field generating lines above and/or below xMR sensor elements 110 and 112. The current generates y-component magnetic fields that are phase shifted by 90° regarding the x-component magnetic fields. The generated y-component magnetic fields have opposite directions for xMR sensor elements 110 and 112 (i.e., the current above and/or below xMR sensor elements 110 flows in the opposite direction of the current above and/or below xMR sensor elements 112.

To provide a continuous change of the applied current (and not a switching characteristic), the resistance change of xMR structure 128 is proportional to the magnetic field change. To provide the resistance change of xMR structure 128, xMR structure 128 has a very high magnetic anisotropy (i.e., a very small width) comprising a minimum hysteresis that is very close to an ideal behavior.

Figure 3:
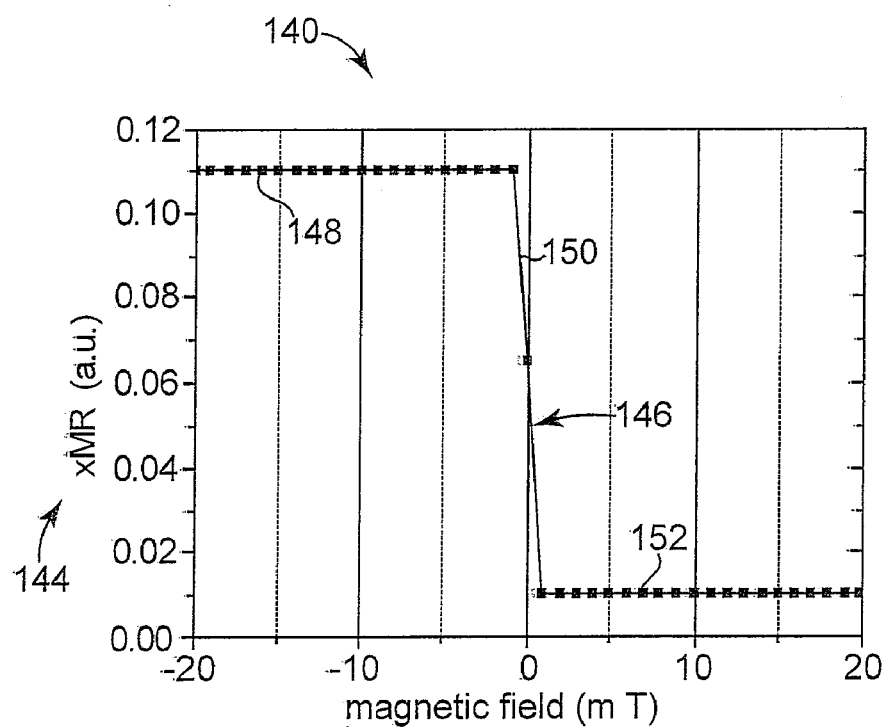
FIG. 3 is a graph illustrating one embodiment of minor loop behavior of an xMR structure having low magnetic anisotropy.

FIG. 3 is a graph 140 illustrating one embodiment of minor loop behavior of an xMR structure having low magnetic anisotropy. In one embodiment, xMR structures 120, 122, 124, and 126 have low magnetic anisotropy as illustrated by graph 140. Graph 140 includes magnetic field in millitesla (mT) on x-axis 142 and xMR signal amplitude in arbitrary units (a.u.) on y-axis 144. Signal 146 includes a switching characteristic illustrated by a level portion 148, a switching portion 150, and a level portion 152.

In response to a magnetic field below approximately −1 mT, the xMR structure provides a constant signal of approximately 0.11 a.u. in level portion 148. In response to a magnetic field above approximately 1 mT, the xMR structure provides a constant signal of approximately 0.01 a.u. in level portion 152. In response to a magnetic field between approximately +/−1 mT, the xMR structure provides a signal between approximately 0.11 a.u. and 0.01 a.u. in switching portion 150, such that at approximately 0 mT, the xMR structure provides a signal of approximately 0.06 a.u.

Figure 4:
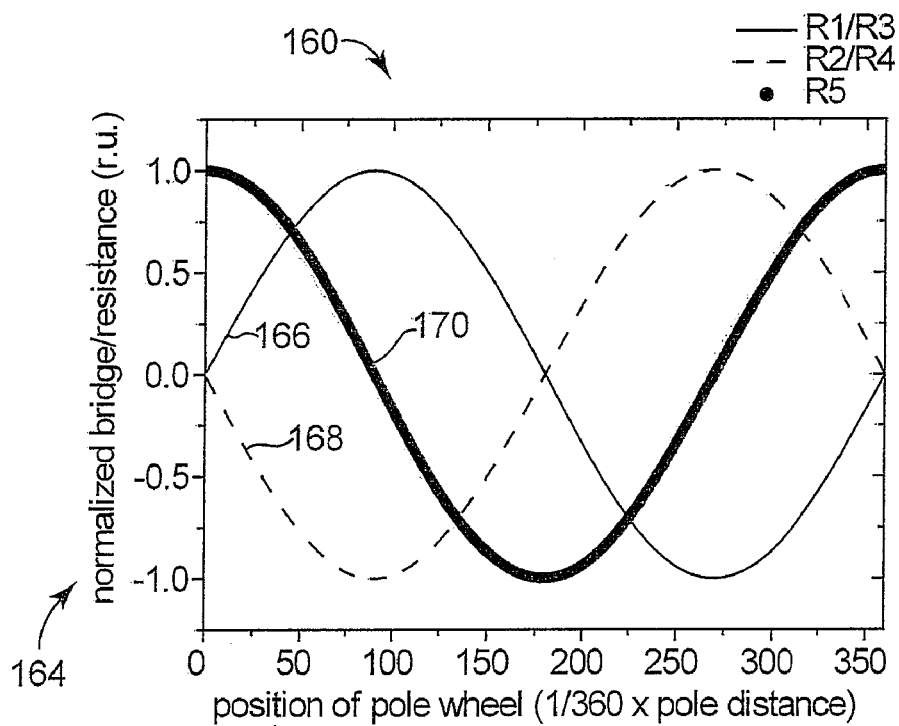
FIG. 4 is a graph illustrating one embodiment of the response of the xMR structures in response to a rotating pole wheel.

FIG. 4 is a graph 160 illustrating one embodiment of the response of xMR structures 120, 122, 124, 126, and 128 in response to a rotating pole wheel. Graph 160 includes pole wheel position (1/360 times pole distance) on x-axis 162 and normalized resistance in relative units (r.u.) on y-axis 164. The resistance of xMR structures 120 and 122 is indicated by signal 166. The resistance of xMR structures 124 and 126 is indicated by signal 168. The resistance of xMR structure 128 is indicated by signal 170.

As indicated in graph 160, there is a phase correlation of approximately 180° between signals 166 and 168. Signal 170 is phase shifted by +/−90° with respect to signals 166 and 168. Therefore, by applying a current proportional to signal 170 to magnetic field generating lines above and/or below xMR sensor elements 110 and 112, y-component magnetic fields that are phase shifted by 90° regarding the x-component magnetic fields are generated.

Figure 5A:
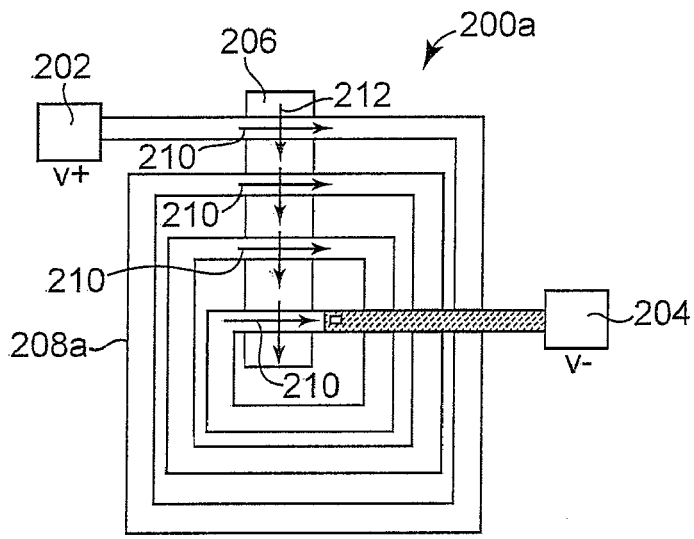
FIG. 5A is a diagram illustrating one embodiment of magnetic field generating lines adjacent to an xMR structure for generating an additional lateral y-component magnetic field perpendicular to the magnetic field to be measured.

FIG. 5A is a diagram illustrating one embodiment 200a of a magnetic field generating line 208a adjacent to an xMR structure 206 for generating an additional lateral y-component magnetic field perpendicular to the field to be measured. Magnetic field generating line 208a is electrically coupled on one end to a positive voltage (V+) 202 and on another end to a negative voltage (V−) 204. In one embodiment, xMR structures 120, 122, 124, and 126 are similar to xMR structure 206. Magnetic field generating line 208a is spiral shaped to provide a current indicated at 210, which generates a magnetic field perpendicular to the current as indicated at 212 in xMR structure 206.

By providing a current proportional to the resistance of xMR structure 128, the 90° phase shifted y-component magnetic field is generated at the location of xMR structure 206. Magnetic field generating line 208a is placed above and/or below xMR structure 206 to generate the lateral magnetic field component (y-component) perpendicular to the field to be measured (x-component). To obtain a desired slope of the transfer characteristic when the transducer or pole wheel rotates past the xMR sensor, the magnitude of the generated y-component magnetic field is correlated to the x-component magnetic field.

In one embodiment, 10-20% of the x-component magnetic field for the y-component magnetic field is sufficient to provide a slow and well controlled rotation of the free layer magnetization. If only a switching of the magnetization into the +y or −y direction is desired (i.e., if only the zero crossing is evaluated), the generated y-component magnetic field is at least so high as to guarantee the free layer to be magnetically saturated. In one embodiment, y-component magnetic fields around approximately 0.2 mT are sufficient.

Figure 5B:
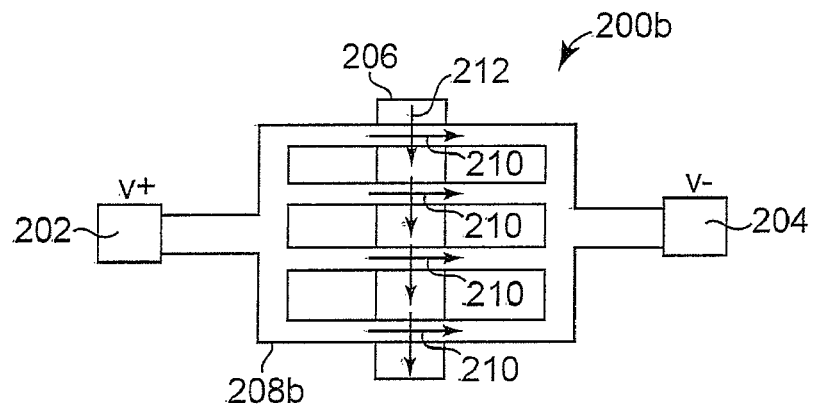
FIG. 5B is a diagram illustrating another embodiment of magnetic field generating lines adjacent to an xMR structure for generating an additional lateral y-component magnetic field perpendicular to the magnetic field to be measured.

FIG. 5B is a diagram illustrating another embodiment 200b of magnetic field generating lines 208b adjacent xMR structure 206 for generating an additional lateral y-component magnetic field perpendicular to the field to be measured. In this embodiment, magnetic field generating lines 208b are provided in a comb configuration to provide the current as indicated at 210, which generates a magnetic field perpendicular to the current as indicated at 212 in xMR structure 206. Magnetic field generating lines 208b function similarly to magnetic field generating line 208a previously described and illustrated with reference to FIG. 5A.

Figure 5C:
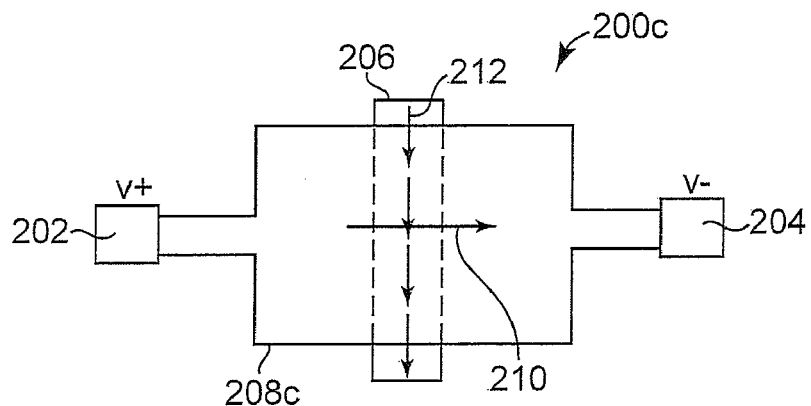
FIG. 5C is a diagram illustrating another embodiment of a magnetic field generating line adjacent to an xMR structure for generating an additional lateral y-component magnetic field perpendicular to the magnetic field to be measured.

FIG. 5C illustrates another embodiment 200c of a magnetic field generating line 208c adjacent to xMR structure 206 for generating an additional lateral y-component magnetic field perpendicular to the field to be measured. In this embodiment, magnetic field generating line 208c is provided as a wide singular line to provide the current as indicated at 210, which generates a magnetic field perpendicular to the current as indicated at 212 in xMR structure 206. Magnetic field generating line 208c functions similarly to magnetic field generating line 208a previously described and illustrated with reference to FIG. 5A.

Figure 6A:
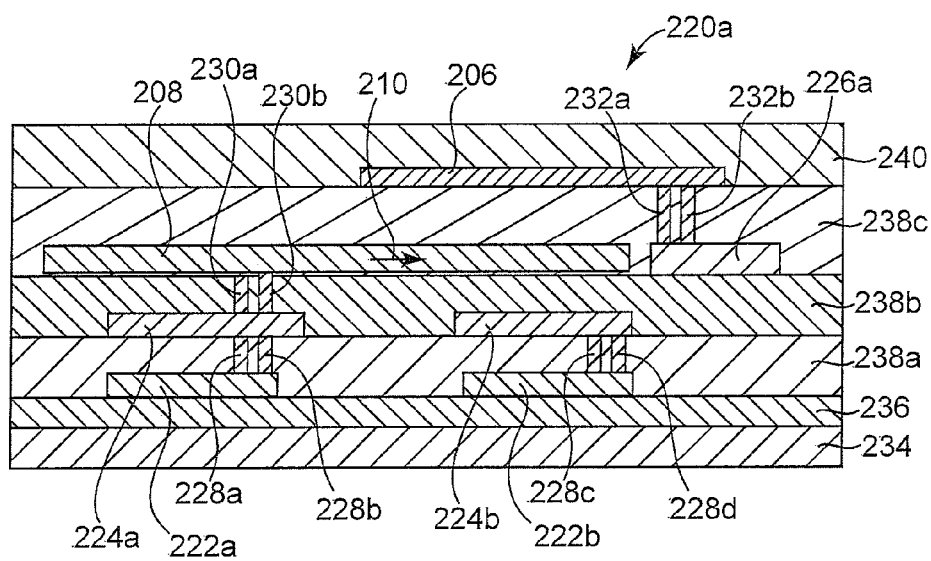
FIG. 6A illustrates a cross-sectional view of one embodiment of an xMR sensor including a magnetic field generating line below an xMR structure.

FIG. 6A illustrates a cross-sectional view of one embodiment of an xMR sensor 220a including a magnetic field generating line below an xMR structure. The xMR sensor 220a includes an xMR structure 206, a magnetic field generating line 208, first metallization portions 222a-222b, second metallization portions 224a-224b, third metallization portion 226a, underlying structures 234, via contacts 228a-228d, 230a-230b, and 232a-232b, oxide 236, intermetal oxide 238a-238c, and passivation material 240. In this embodiment, xMR structure 206 is positioned above magnetic field generating line 208. A current as indicated at 210 through magnetic field generating line 208 generates the additional lateral y-component magnetic field perpendicular to the field to be measured.

The xMR structure 206 is electrically coupled to third metallization portion 226a through via contacts 232a and 232b. Magnetic field generating line 208 is electrically coupled to second metallization portion 224a through via contacts 230a and 230b. Second metallization portion 224a is electrically coupled to first metallization portion 222a through via contacts 228a and 228b. Second metallization portion 224b is electrically coupled to first metallization portion 222b through via contacts 228c and 228d. Underlying structures 234 are separated from first metallization portions 222a and 222b by oxide 236. Intermetal oxide 238a-238c surrounds metallization portions 222a-222b, 224a-224b, 226a, via contacts 228a-228d, 230a-230b, and 232a-232b, and magnetic field generating line 208. Passivation material 240 protects xMR structure 206.

Figure 6B:
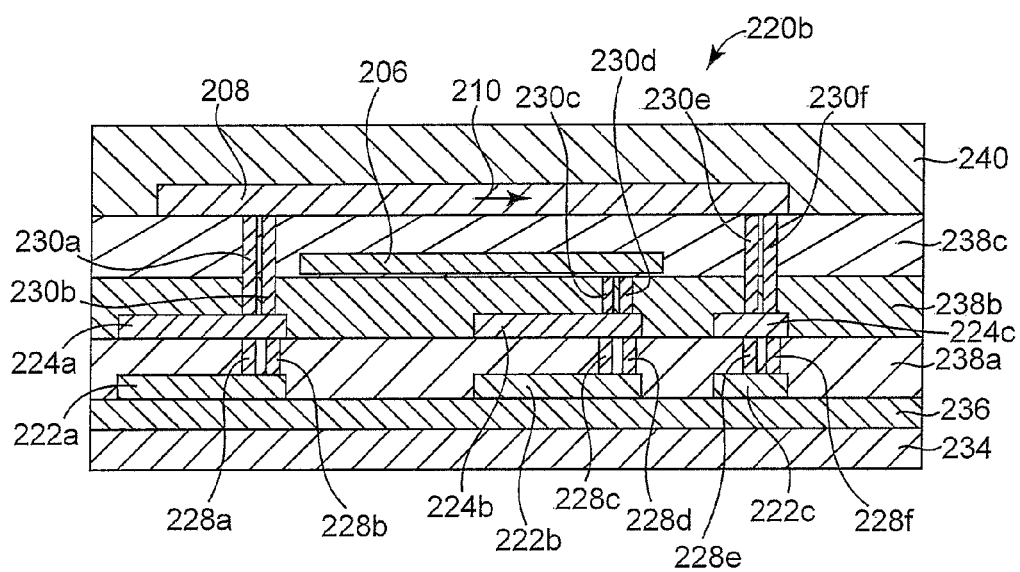
FIG. 6B illustrates a cross-sectional view of one embodiment of an xMR sensor including a magnetic field generating line above an xMR structure.

FIG. 6B illustrates a cross-sectional view of one embodiment of an xMR sensor 220b including a magnetic field generating line above an xMR structure. The xMR sensor 220b includes an xMR structure 206, a magnetic field generating line 208, first metallization portions 222a-222c, second metallization portions 224a-224c, underlying structures 234, via contacts 228a-228f and 230a-230f, oxide 236, intermetal oxide 238a-238c, and passivation material 240. In this embodiment, xMR structure 206 is positioned below magnetic field generating line 208. A current as indicated at 210 through magnetic field generating line 208 generates the additional lateral y-component magnetic field perpendicular to the field to be measured.

One side of magnetic field generating line 208 is electrically coupled to second metallization portion 224a through via contacts 230a and 230b. Second metallization portion 224a is electrically coupled to first metallization portion 222a through via contacts 228a and 228b. The other side of magnetic field generating line 208 is electrically coupled to second metallization portion 224c through via contacts 230e and 230f. Second metallization portion 224c is electrically coupled to first metallization portion 222c through via contacts 228e and 228f. The xMR structure 206 is electrically coupled to second metallization portion 224b through via contacts 230c and 230d. Second metallization portion 224b is electrically coupled to first metallization portion 222b through via contacts 228c and 228d. Underlying structures 234 are separated from first metallization portions 222a-222c by oxide 236. Intermetal oxide 238a-238c surrounds metallization portions 222a-222c, 224a-224c, via contacts 228a-228f and 230a-230f, and xMR structure 206. Passivation material 240 protects magnetic field generating line 208.

Figure 7:
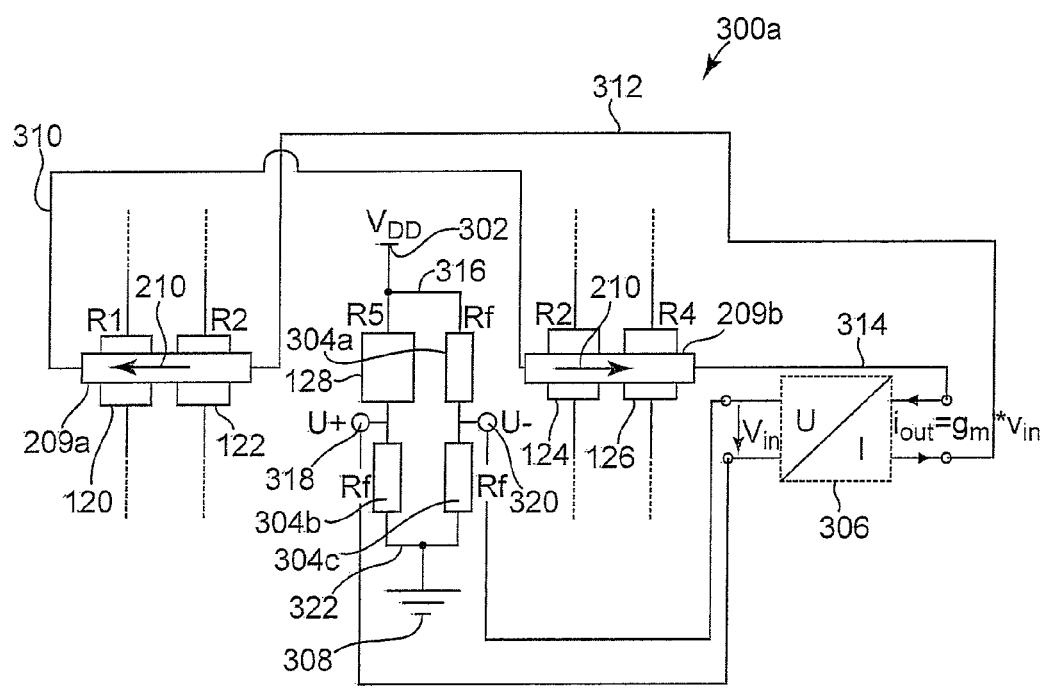
FIG. 7 is a schematic diagram illustrating one embodiment of a circuit for generating a 90° phase shifted y-component magnetic field adjacent to the xMR structures.

FIG. 7 is a schematic diagram illustrating one embodiment of a circuit 300a for generating a 90° phase shifted y-component magnetic field adjacent to xMR structures 120, 122, 124, and 126. Circuit 300a includes magnetic field generating lines 209a and 209b, xMR structure 128, resistors 304a-304c, and a voltage controlled current source 306.

A voltage source ($V_{DD}$) 302 is electrically coupled to one side of xMR structure 128 and one side of resistor 304a through signal path 316. The other side of xMR structure 128 is electrically coupled to one side of resistor 304b and a first input of voltage controlled current source 306 through U+ signal path 318. The other side of resistor 304a is electrically coupled to one side of resistor 304c and a second input of voltage controlled current source 306 through U− signal path 320. The other side of resistor 304b and the other side of resistor 304c are electrically coupled to a common or ground 308 through signal path 322.

A first output of voltage controlled current source 306 is electrically coupled to one side of magnetic field generating line 209a through signal path 312. The other side of magnetic field generating line 209a is electrically coupled to one side of magnetic field generating line 209b through signal path 310. The other side of magnetic field generating line 209b is electrically coupled to a second output of voltage controlled current source 306 through signal path 314.

Magnetic field generating line 209a is positioned above or below xMR structures 120 and 122. Magnetic field generating line 209b is positioned above or below xMR structures 124 and 126. Current 210 through magnetic field generating line 209a flows in the opposite direction from current 210 through magnetic field generating line 209b.

The voltage ($V_{in}$) between U+ signal path 318 and U− signal path 320, which is input to voltage controlled current source 306, controls the output current 210 of voltage controlled current source 306. The output current ($i_{out}$) of voltage controlled current source 306 equals the transconductance ($g_m$) of voltage controlled current source 306 times the input voltage ($V_{in}$).

The xMR structure 128 and resistors 304a-304c are arranged in a Wheatstone bridge configuration. Resistors 304a-304c each have the same resistance value ($R_f$), which is approximately the same resistance as xMR structure 128 with no magnetic field present. Therefore, a change in the resistance of xMR structure 128 adjusts the voltage input to voltage controlled current source 306 and thus the current applied through magnetic field generating lines 209a and 209b. Circuit 300a therefore generates a 90° phase shifted y-component magnetic field at the location of xMR structures 120, 122, 124, and 126 that is proportional to the resistance of xMR structure 128.

Figure 8:
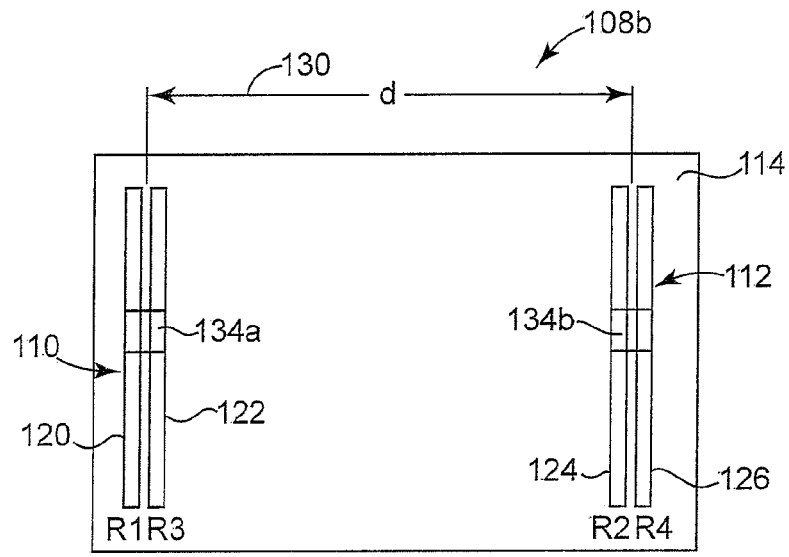
FIG. 8 illustrates a top view of another embodiment of an integrated circuit xMR sensor.

FIG. 8 illustrates a top view of another embodiment of an integrated circuit xMR sensor 108b. Integrated circuit xMR sensor 108b includes a substrate 114, xMR sensor elements 110 and 112, and hall elements 134a and 134b. The xMR sensor elements 110 include xMR structure 120 (R1) and xMR structure 122 (R3). The xMR structure 120 is adjacent to xMR structure 122. The xMR sensor elements 112 include xMR structure 124 (R2) and xMR structure 126 (R4). The xMR structure 124 is adjacent to xMR structure 126. The xMR sensor elements 110 are at a distance "d" as indicated at 130 from xMR sensor elements 112. Hall element 134a is positioned above or below xMR sensor elements 110. Hall element 134b is positioned above or below xMR sensor elements 112.

In xMR sensor 108b, hall elements 134a and 134b provide a similar function as xMR structure 128 in xMR sensor 108a. Hall elements 134a and 134b measure the z-component magnetic field and generate a signal that is phase shifted by 90° with respect to the in-plane x-component magnetic field. Hall elements 134a and 134b inherently provide hysteresis free signals. Therefore, a pure uniaxial magnetic field (i.e., the x-component magnetic field) is converted into a rotating magnetic field that is measured by xMR sensor elements 110 and 112.

A current proportional to the resistance of hall elements 134a and 134b is generated and applied to magnetic field generating lines above and/or below xMR sensor elements 110 and 112. The current generates y-component magnetic fields that are phase shifted by 90° regarding the x-component magnetic fields. The generated y-component magnetic fields have opposite directions for xMR sensor elements 110 and 112 (i.e., the current above and/or below xMR sensor elements 110 flows in the opposite direction of the current above and/or below xMR sensor elements 112.

Figure 9:
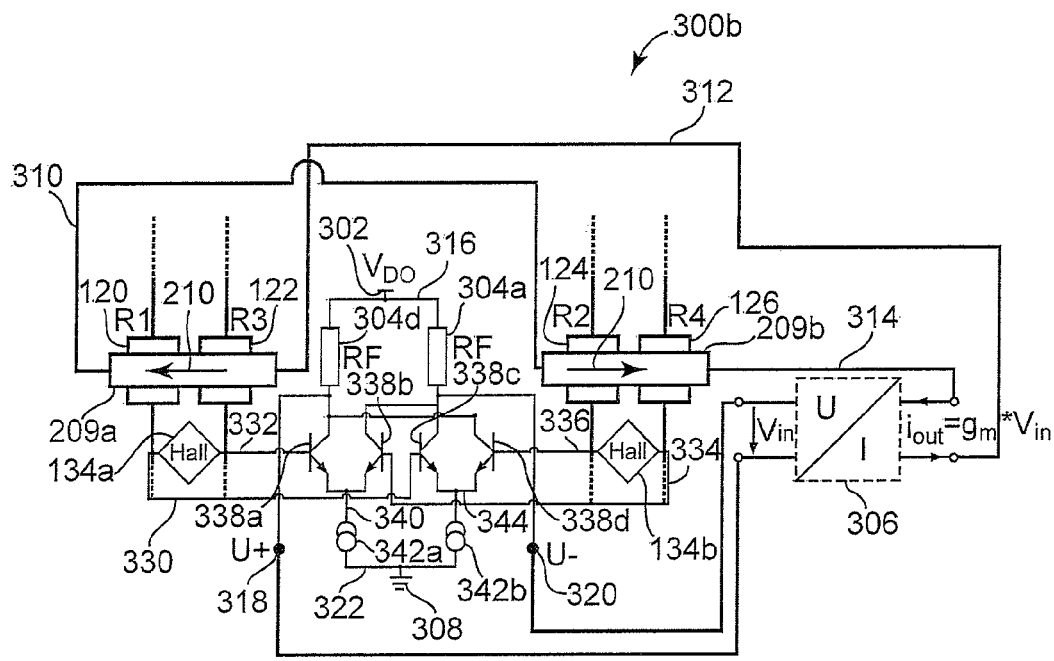
FIG. 9 is a schematic diagram illustrating another embodiment of a circuit for generating a 90° phase shifted y-component magnetic field adjacent to the xMR structures.

FIG. 9 is a schematic diagram illustrating another embodiment of a circuit 300b for generating a 90° phase shifted y-component magnetic field adjacent to xMR structures 120, 122, 124, and 126. Circuit 300b is similar to circuit 300a previously described and illustrated with reference to FIG. 7, except that in circuit 300b xMR structure 128 is replaced with resistor 304d and resistors 304b and 340c are replaced with hall elements 134a and 134b, transistors 338a-338d, and current sources 342a and 342b. In this embodiment, resistors 304a and 304d, transistors 338a-338d, and current sources 342a and 342b are arranged in the Wheatstone bridge configuration.

One side of hall element 134a is electrically coupled to the base of transistor 338c through signal path 330, and the other side of hall element 134a is electrically coupled to the base of transistor 338a through signal path 332. One side of hall element 134b is electrically coupled to the base of transistor 338d through signal path 336, and the other side of hall element 134b is electrically coupled to the base of transistor 338b through signal path 334. The collector of transistors 338a and 338d are electrically coupled to one side of resistor 304d through U+ signal path 318. The other side of resistor 304d is electrically coupled to voltage source ($V_{DD}$) 302 through signal path 316. The collectors of transistors 338b and 338c are electrically coupled to one side of resistor 304a through U− signal path 320. The emitters of transistors 338a and 338b are electrically coupled to one side of current source 342a through signal path 340. The other side of current source 342a is electrically coupled to common or ground 308 through signal path 322. The emitters of transistors 338c and 338d are electrically coupled to one side of current source 342b through signal path 344. The other side of current source 342b is electrically coupled to common or ground 308 through signal path 322.

Resistors 304a and 304d each have the same resistance ($R_f$), which is approximately the same resistance as hall elements 134a and 134b with no magnetic field present. Therefore, a change in the resistance of hall elements 134a and 134b adjusts the voltage input to voltage controlled current source 306 and thus the current applied through magnetic field generating lines 209a and 209b. Circuit 300b therefore generates a 90° phase shifted y-component magnetic field at the location of xMR structures 120, 122, 124, and 126 that is proportional to the resistance of hall elements 134a and 134b.

Figure 10:
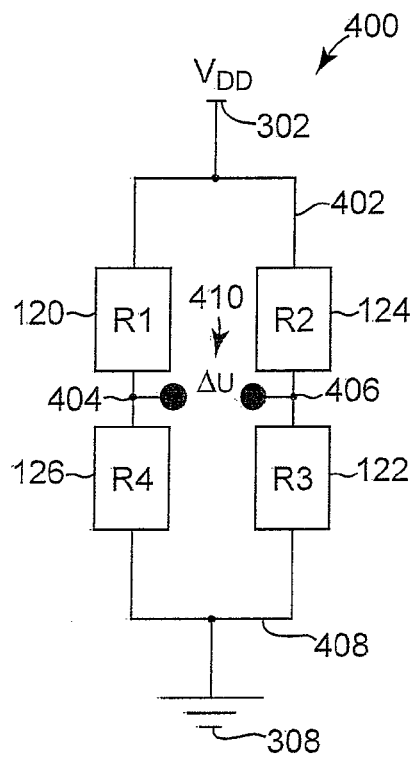
FIG. 10 is a schematic diagram illustrating one embodiment of a circuit for sensing a magnetic field based on the xMR structures.

FIG. 10 is a schematic diagram illustrating one embodiment of a circuit 400 for sensing a magnetic field based on xMR structures 120, 122, 124, and 126. Voltage source ($V_{DD}$) 302 is electrically coupled to one side of xMR structure 120 and one side of xMR structure 124 through signal path 402. The other side of xMR structure 120 is electrically coupled to one side of xMR structure 126 through signal path 404. The other side of xMR structure 124 is electrically coupled to one side of xMR structure 122 through signal path 406. The other side of xMR structure 126 and the other side of xMR structure 122 are electrically coupled to common or ground 308 through signal path 408.

The xMR structures 120, 122, 124, and 126 are arranged in a Wheatstone bridge configuration. The output of the Wheatstone bridge is ΔU 410 between signal paths 404 and 406. The output signal is proportional to the resistances of xMR structures 120, 122, 124, and 126 in response to a pole wheel rotating past the xMR structures.

Figure 11:
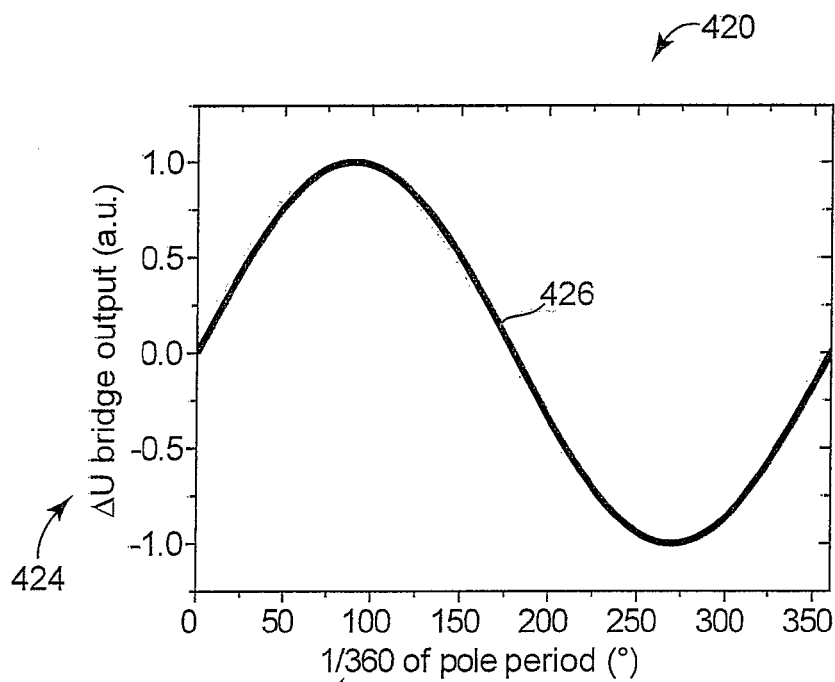
FIG. 11 is a graph illustrating one embodiment of an output signal of the circuit for sensing a magnetic field based on the xMR structures.

FIG. 11 is a graph 420 illustrating one embodiment of an output signal of circuit 400 for sensing a magnetic field based on xMR structures 120, 122, 124, and 126. Graph 420 includes pole wheel position (1/360 of the pole wheel period) in degrees on x-axis 422 and the ΔU Wheatstone bridge output signal amplitude in arbitrary units (a.u.) on y-axis 424. In one embodiment, in response to a rotating pole wheel, the output signal as indicated at 426 is a sine wave. Output signal 426 is used to determine the speed and/or position of the pole wheel with respect to the xMR sensor.

Figure 12:
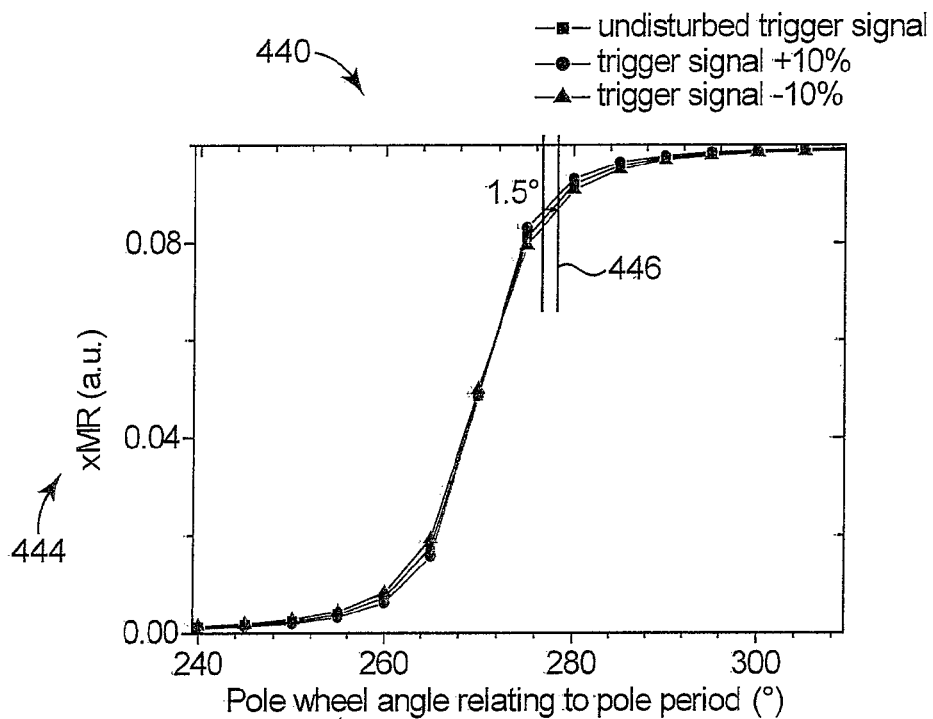
FIG. 12 is a graph illustrating one embodiment of a simulated signal from an xMR structure for an undisturbed and for a +/−10% varied trigger signal for the generation of the 90° phase shifted y-component magnetic field.

FIG. 12 is a graph 440 illustrating one embodiment of a simulated signal from an xMR structure 120, 122, 124, or 126 for an undisturbed and for a +/−10% varied trigger signal (i.e., the signal proportional to the resistance of xMR structure 128 or hall elements 134a and 134b) for the generation of the 90° phase shifted y-component magnetic field. Graph 440 includes pole wheel angle in degrees relating to the pole period on x-axis 442 and xMR signal amplitude in arbitrary units (a.u.) on y-axis 444. Graph 440 illustrates the effect on the signal of an xMR structure in response to a rotating pole wheel having only an x-component magnetic field. The signal is based on a sinusoidal magnetic field with a 20 mT amplitude and a 90° phase shifted trigger signal with a 2 mT amplitude (and +/−0.2 mT "noise") at a linear range of Hk=10 mT.

The reproducibility of the phase of the zero crossing point is a key parameter for the sensor performance in many applications. At a phase angle of 90° where the x-component magnetic field equals zero and the y-component magnetic field equals a maximum indicating the zero crossing point of the sensor signal in the Wheatstone bridge configuration, noise or hysteresis of the trigger signal has almost no effect on the resulting sensor signal, since the magnetization is in a saturated state (into y direction) that is insensitive to small magnetic field variations. As a result, hysteresis or noise caused variations of the trigger signal have no significant impact on the performance of a sensor according to the preset invention. For phase angles other than 90° (and 270°), a varying trigger signal results in a different effective magnetic field vector (equal to a different field direction) thereby affecting the sensor signal. Towards the saturation regions of the signal, a phase shift occurs that is within the relevant signal range of 15%-85% of the maximum signal. For a +/−10% variation of the trigger signal, there is a maximum of 1.5° of hysteresis as indicated at 446. The maximum of 1.5° of hysteresis is substantially less than typical linear xMR sensors, which typically have a maximum hysteresis of up to approximately 6° in response to a +/−10% variation of the trigger signal.

Figure 13:
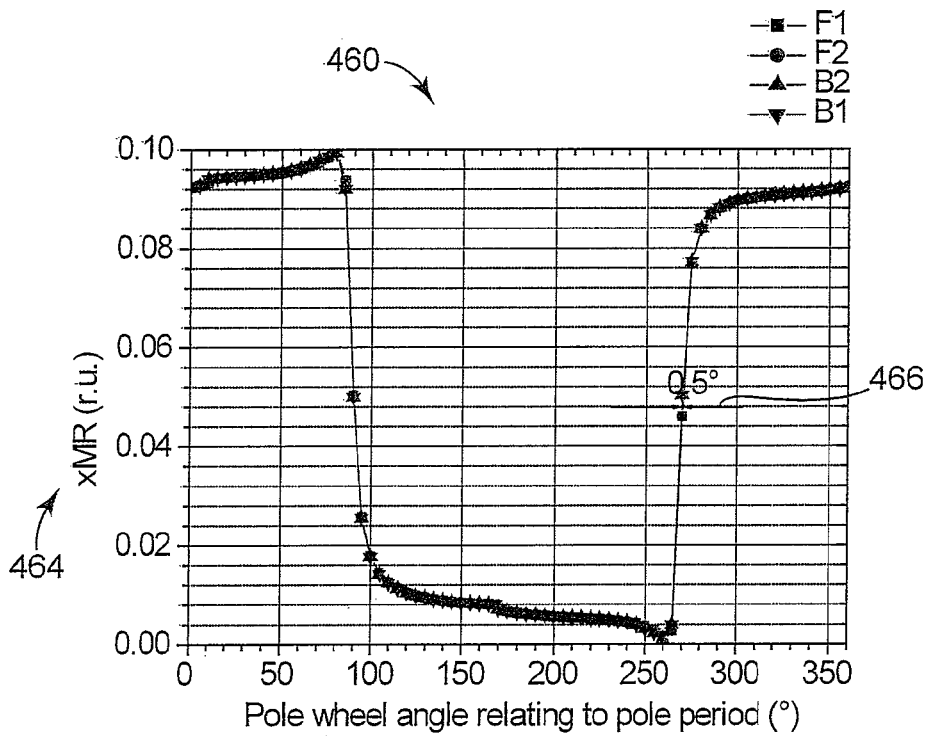
FIG. 13 is a graph illustrating one embodiment of a simulated signal from an xMR structure for two forward cycles and two backward cycles with the desired magnetic field axis tilted by 30° with respect to the optimum configuration.

FIG. 13 a graph 460 illustrating one embodiment of a simulated signal from an xMR structure 120, 122, 124, or 126 for two forward cycles and two backward cycles with the desired magnetic field axis tilted by 30° with respect to the optimum configuration. Graph 460 includes pole wheel angle relating to pole wheel period in degrees on x-axis 462 and xMR structure resistance in relative units (r.u.) on y-axis 464. Graph 460 illustrates an xMR structure signal in response to a pole wheel having a tilt angle of 30° with respect to the xMR structure. The 30° tilt angle is greater than typically observed and tolerated in actual applications but is provided to illustrate the advantages of the xMR sensor. Graph 460 illustrates the resistance change for two forward cycles (F1 and F2, 0°-720°) and two backward cycles (B1 and B2, 720°-0°).

An xMR sensor including xMR structures 120, 122, 124, and 126, even if not in the full range, exhibits the full xMR signal independent of the tilt angle. In addition, the hysteresis when changing the direction of rotation is a maximum of approximately 0.5° as indicated at 466. The maximum of 0.5° of hysteresis is substantially less than typical linear xMR sensors, which typically have a maximum hysteresis of up to approximately 4° in response to a 30° tilt angle.

Embodiments provide an xMR sensor for use as a rotational speed sensor. The xMR sensor exhibits no or low hysteresis for high tilt angles between the transducer or pole wheel and the xMR sensor. Therefore, the xMR sensor provides increased robustness with regard to both package tolerance and adjustment tolerance compared to typical linear xMR sensors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    two first adjacent magneto-resistive effect (xMR) structures, each first xMR structure configured to sense a first magnetic field direction; and
    two second adjacent xMR structures at a distance from the two first xMR structures, each second xMR structure configured to sense a second magnetic field direction;
    wherein the two first xMR structures and the two second xMR structures are configured for in-plane magnetic field components perpendicular to the first magnetic field and the second magnetic field and phase shifted by approximately 90° from the first magnetic field and the second magnetic field acting on the two first xMR structures and the two second xMR structures.

2. The integrated circuit of claim 1, wherein the two first xMR structures and the two second xMR structures are electrically coupled in a Wheatstone bridge configuration.

3. The integrated circuit of claim 1, further comprising:
a first line adjacent the two first xMR structures configured to provide a first in-plane magnetic field component perpendicular to the first magnetic field; and
a second line adjacent the two second xMR structures configured to provide a second in-plane magnetic field component perpendicular to the second magnetic field.

4. The integrated circuit of claim 3, wherein the first line is above the two first xMR structures, and
wherein the second line is above the two second xMR structures.

5. The integrated circuit of claim 3, wherein the two first xMR structures and the two second xMR structures are configured such that the first magnetic field provided by a transducer at the two first xMR structures is phase shifted by approximately 180° from the second magnetic field provided by the transducer at the two second xMR structures; and
wherein the first in-plane magnetic field component is phase shifted by approximately 180° from the second in-plane magnetic field component.

6. The integrated circuit of claim 5, further comprising:
a third xMR structure about halfway between the two first xMR structures and the two second xMR structures, the third xMR structure having an anisotropy axis perpendicular to the first magnetic field.

7. The integrated circuit of claim 6, further comprising:
a circuit configured to provide a current to the first line and the second line proportional to a resistance of the third xMR structure.

8. The integrated circuit of claim 5, further comprising:
a first hall element adjacent the two first xMR structures configured to provide a first signal phase shifted by 90° from a second signal from the two first xMR structures; and
a second hall element adjacent the two second xMR structures configured to provide a third signal phase shifted by 90° from a fourth signal from the two second xMR structures.

9. The integrated circuit of claim 8, further comprising:
a circuit configured to provide a current to the first line and the second line based on the first signal and the third signal.

10. The integrated circuit of claim 5, wherein the transducer comprises a pole wheel including a plurality of magnetic dipoles or a tooth wheel in combination with a back bias magnet.

11. The integrated circuit of claim 10, wherein the two first xMR structures and the two second xMR structures are configured to be aligned with the transducer such that the transducer provides the in-plane magnetic field components having an in-plane rotating magnetic field direction.

12. A sensor comprising:
a transducer wheel configured to provide alternating magnetic fields;
two first adjacent magneto-resistive effect (xMR) structures;
two second adjacent xMR structures at a distance from the two first xMR structures such that a first magnetic field at the two first xMR structures provided by the transducer wheel is phase shifted by approximately 180° from a second magnetic field provided by the transducer wheel at the two second xMR structures; and
means for providing in-plane magnetic field components perpendicular to the first magnetic field and the second magnetic field and phase shifted by approximately 90° from the first magnetic field and the second magnetic field acting on the two first xMR structures and the two second xMR structures,
wherein the two first xMR structures and the two second xMR structures are configured to measure magnetic field direction.

13. The sensor of claim 12, wherein a first in-plane magnetic field component acting on the two first xMR structures is phase shifted by approximately 180° from a second in-plane magnetic field component acting on the two second xMR structures.

14. The sensor of claim 12, wherein the two first xMR structures and the two second xMR structures are electrically coupled in a Wheatstone bridge configuration.

15. The sensor of claim 12, wherein the transducer wheel comprises a pole wheel or a tooth wheel in combination with a back bias magnet.

16. A method for measuring a magnetic field, the method comprising:
providing two first adjacent magneto-resistive effect (xMR) structures and two second adjacent xMR structures configured to measure magnetic field direction;
rotating a transducer to provide a first magnetic field at the two first xMR structures and to provide a second magnetic field phase shifted by approximately 180° from the first magnetic field at the two second xMR structures; and
generating in-plane magnetic field components perpendicular to the first magnetic field and the second magnetic field and phase shifted by approximately 90° from the first magnetic field and the second magnetic field acting on the two first xMR structures and the two second xMR structures.

17. The method of claim 16, wherein generating the in-plane magnetic field components comprises adjusting an alignment of the transducer with respect to the two first xMR structures and the two second xMR structures to generate the in-plane magnetic field components having an in-plane rotating magnetic field direction.

18. The method of claim 16, further comprising:
applying a current through a first line adjacent the two first xMR structures to generate a first in-plane magnetic field component perpendicular to the first magnetic field; and
applying the current through a second line adjacent the two second xMR structures to generate a second in-plane magnetic field component perpendicular to the second magnetic field.

19. The method of claim 18, wherein applying the current through the second line comprises applying the current through the second line to generate a second in-plane magnetic field component that is phase shifted by approximately 180° from the first in-plane magnetic field component.

20. The method of claim 18, further comprising:
providing a third xMR structure about halfway between the two first xMR structures and the two second xMR structures having an anisotropy axis perpendicular to the first magnetic field; and
generating the current based on a resistance of the third xMR structure.

21. The method of claim 18, further comprising:
providing a first hall element adjacent the two first xMR structures to provide a first signal phase shifted by 90° from a second signal from the two first xMR structures; and
providing a second hall element adjacent the two second xMR structures to provide a third signal phase shifted by 90° degrees from a fourth signal from the two second xMR structures; and generating the current based on the first signal and the third signal.

22. The method of claim 16, wherein rotating the transducer comprises rotating a transducer including a plurality of magnetic dipoles or rotating a transducer including a tooth wheel in combination with a back bias magnet.

* * * * *